United States Patent
Regimbal et al.

(10) Patent No.: US 6,785,142 B1
(45) Date of Patent: Aug. 31, 2004

(54) SYSTEM AND METHOD FOR DETECTING BLANK MODULES

(75) Inventors: Laurent A. Regimbal, Round Rock, TX (US); Jinsaku Masuyama, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/374,461

(22) Filed: Feb. 26, 2003

(51) Int. Cl.$^7$ ................................................ H05K 7/16
(52) U.S. Cl. ..................... 361/727; 361/721; 439/928; 174/16.3
(58) Field of Search ................................ 361/683–687, 361/724–727, 752, 796, 788, 679, 715–721; 439/61, 928; 174/15.1, 16.1, 16.3; 165/80.2, 80.3

(56) References Cited

U.S. PATENT DOCUMENTS

| | | | |
|---|---|---|---|
| 6,325,636 B1 | 12/2001 | Hipp et al. .................... 439/61 |
| 6,351,384 B1 | 2/2002 | Daikoku et al. ............ 361/704 |
| 6,403,879 B1 | 6/2002 | Clements et al. ............. 174/35 |
| 6,411,506 B1 * | 6/2002 | Hipp et al. .................. 361/686 |
| 6,437,979 B1 | 8/2002 | Unrein ........................ 361/687 |
| 6,437,980 B1 | 8/2002 | Casebolt ...................... 361/687 |
| 6,452,789 B1 | 9/2002 | Pallotti et al. ............... 361/683 |
| 6,459,589 B2 * | 10/2002 | Manweiler et al. .......... 361/752 |
| 6,466,448 B1 | 10/2002 | Baik ........................... 361/752 |
| 6,563,706 B1 * | 5/2003 | Strickler ...................... 361/695 |

OTHER PUBLICATIONS

U.S. Patent Publication US 2002 0122296 A1, Sep. 5, 2002.
U.S. Patent Publication US 2002 0149911 A1, Oct. 17, 2002.

* cited by examiner

*Primary Examiner*—Hung Van Duong
(74) *Attorney, Agent, or Firm*—Baker Botts L.L.P.

(57) ABSTRACT

A system and method for detecting blank modules includes an information handling system including at least one computing component, a modular chassis, a management module, and one or more sensors. The modular chassis includes one or more slots where each slot is operable to receive either the computing module or a blank module. The computing module interfaces with the management module whereby the management module is operable to detect the presence of one or more of the computing modules in one or more of the slots. The sensors are associated with each of the slots and detect if one or more of the blank modules are installed in one or more of the slots. In addition, the sensors provide an indication to a user when one or more of the slots are empty and do contain neither a computing module or a blank module.

19 Claims, 3 Drawing Sheets

SYSTEM AND METHOD FOR DETECTING BLANK MODULES

TECHNICAL FIELD

This disclosure relates in general to the field of information handling systems, and more particularly to a system and method for detecting blank modules.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems, such as servers and storage subsystems, use an increasing amount of power and resources as information handling needs increase. As computing and power requirements continue to increase, users are looking for ways to pack more computing power into smaller spaces while at the same time saving money, conserving energy, and having flexibility. For example, companies are migrating towards high density server applications or modular computing systems, such as blade servers and brick servers, instead of conventional U-sized servers (a U is a standard unit of measure for designating the height in computer enclosures and rack cabinets where 1U equals 1.75 inches). The modular systems include modular components such as blade servers, power supplies, cooling fans, and disk drives that can be easily installed in or removed from the system as individual modules. The most compact conventional U-sized servers are 1U high and typically hold two processors meaning that a maximum of 42 servers with 84 processors can fit in a standard 42U server rack cabinet. With high density servers such as blade servers, a standard 42U server rack cabinet can generally hold up to 84 servers with 168 processors where each server typically has two processors but may have more than two processors.

Increasing the number of servers within a server rack cabinet requires additional cooling in order to account for the heat generated by the operation of the blade servers. Therefore, additional cooling fans or cooling fans having greater cooling capacity are needed in order to prevent the servers from overheating due to the increased heat load of the additional processors. Because the servers are modular components and therefore easily installed and removed within a modular server chassis, a user may not completely fill the modular server chassis with the modular servers resulting in the modular server chassis having one or more empty sections. The empty sections adversely affect the cooling of the installed modular servers. Because air, like water or electricity, flows in the path of least resistance, when the cooling fans pull cooling air into the modular server chassis to cool the modular servers, the majority of the cooling air flows in the empty sections and not over the installed modular servers. Therefore, the installed modular servers do not receive adequate cooling and the operating temperature increases. As the system heats up, a controller for the cooling fans detects the rising system operating temperature and increases the operational speed of the cooling fans to compensate for the increasing operating temperature. The increase in cooling fan speed pulls in additional cooling air but the majority of the cooling air continues to flow through the empty sections and not over the installed modular servers resulting in the operating temperature continuing to increase. As the operating temperature increases, the cooling fans increase operational speed until the operating temperature rises to a dangerous level so that the system shuts down in order to not overheat and cause permanent damage. The system shuts down without any warning to the users and the users lose any data that has not been saved which is frustrating for the users. Furthermore, the system overheating results in system down time and less efficient operation which is disadvantageous to the users.

SUMMARY

Therefore, a need has arisen for a system and method that provides optimal and efficient cooling in an information handling system.

A further need has arisen for a system and method that detects one or more blank modules in an information handling system.

In accordance with the teachings of the present disclosure, a system and method are described which substantially eliminate or reduce disadvantages with previous systems and methods. The installation and detection of one or more blank modules in a modular chassis allows for the efficient and optimal cooling of one or more computing modules.

In accordance with one aspect of the present disclosure, an information handling system is provided. The information handling system includes at least one computing module. A modular chassis including one or more slots receives in each of the slots either the computing module or a blank module. The computing module interfaces with a management module where the management module is operable to detect the presence of one or more of the computing modules in one or more of the slots. One or more sensors associated with the slots detect if one or more of the blank modules are installed in one or more of the slots.

More specifically in one embodiment, the computing module comprises a modular server that includes a module housing and the blank module comprises only the module housing. The computing module transmits an electronic signal to the management module via a midplane so that the management module can detect the presence of one or more of the computing modules in one or more of the slots. The sensors are disposed on the midplane and detect when one or more of the blank modules are disposed in one or more of the slots. When a slot is empty and therefore contains neither a computing module nor a blank module, the sensor provides an indication to a user that the slot is empty.

In another aspect of the present disclosure, a method for detecting one or more blank modules in a modular system is disclosed. The method includes determining if one or more computing modules are installed in one or more slots of a modular chassis and if one or more blank modules are installed in one or more of the slots of the modular chassis. Based on the determination of the type of modules installed in the slots, the method identifies one or more of the slots that are empty and therefore contain neither a computing module or a blank module and provides an indication regarding the one nor more empty slots.

The present disclosure provides a number of important technical advantages. One important technical advantage is the efficient cooling of the system. Installing one or more blank modules in slots not containing a computing module in the modular chassis results in no empty slots and allows the system to behave as if each slot is occupied by a computing module. Because there are no empty slots, there is no path of least resistance for the cooling air flow to follow. Therefore, when the cooling fans draw in air to cool the computing modules, the cooling air passes evenly over all the computing modules sufficiently cooling the computing modules. Because each computing module receives adequate cooling, the system does not overheat and the cooling fans do not need to increase operational speeds in order to cool the system. Therefore, the system is more efficient and economical to operate because the cooling fans operate at an efficient operating speed and are not overextended. Furthermore, the efficient cooling due to the presence of the blank modules prevents the system from overheating and shutting down on the user resulting in less system downtime and unexpected losses of data.

Another important technical advantage of the present disclosure is the ability to detect the presence of blank modules in the modular chassis. Being able to detect the absence of a blank module and therefore determine which slots are empty allows the user to take action before the system experiences a malfunction. For instance, if the system includes an empty slot, the majority of the cooling air flows through the empty slot instead of over the computing modules which may result in the system overheating and shutting down. But the sensors detect when a slot does not contain a blank module and provide an indication to the user that there is an empty slot which may cause a system malfunction. The ability to sense the presence of the blank modules and alert the user to any potential problems allows the user to proactively react to prevent system failures due to overheating. In addition, the inclusion of one or more of the blank modules allows for an EMI (electromagnetic interference) seal which prevents EMI which may occur if the slots of the modular chassis are not properly sealed with either a computing module or a blank module.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to the figures, wherein like numbers are used to indicate like and corresponding parts.

Previous modular computing systems and components have been designed without taking into account the effect of empty slots on the operation of the computing modules installed within a modular chassis. Typically slots not including a computing module are left empty causing problems with a proper EMI seal and the cooling air pulled in by one or more cooling fans to cool the computing modules. The cooling air follows the path of least resistance, here the empty slots, and therefore the installed computing modules do not receive adequate cooling and are likely to overheat. The present disclosure allows for a system and method for installing and detecting blank modules that allows for efficient and adequate cooling of the computing modules and provides warnings when one or more blank modules are not installed in the empty slots of a modular chassis.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more-buses operable to transmit communications between the various hardware components.

Figure 1:
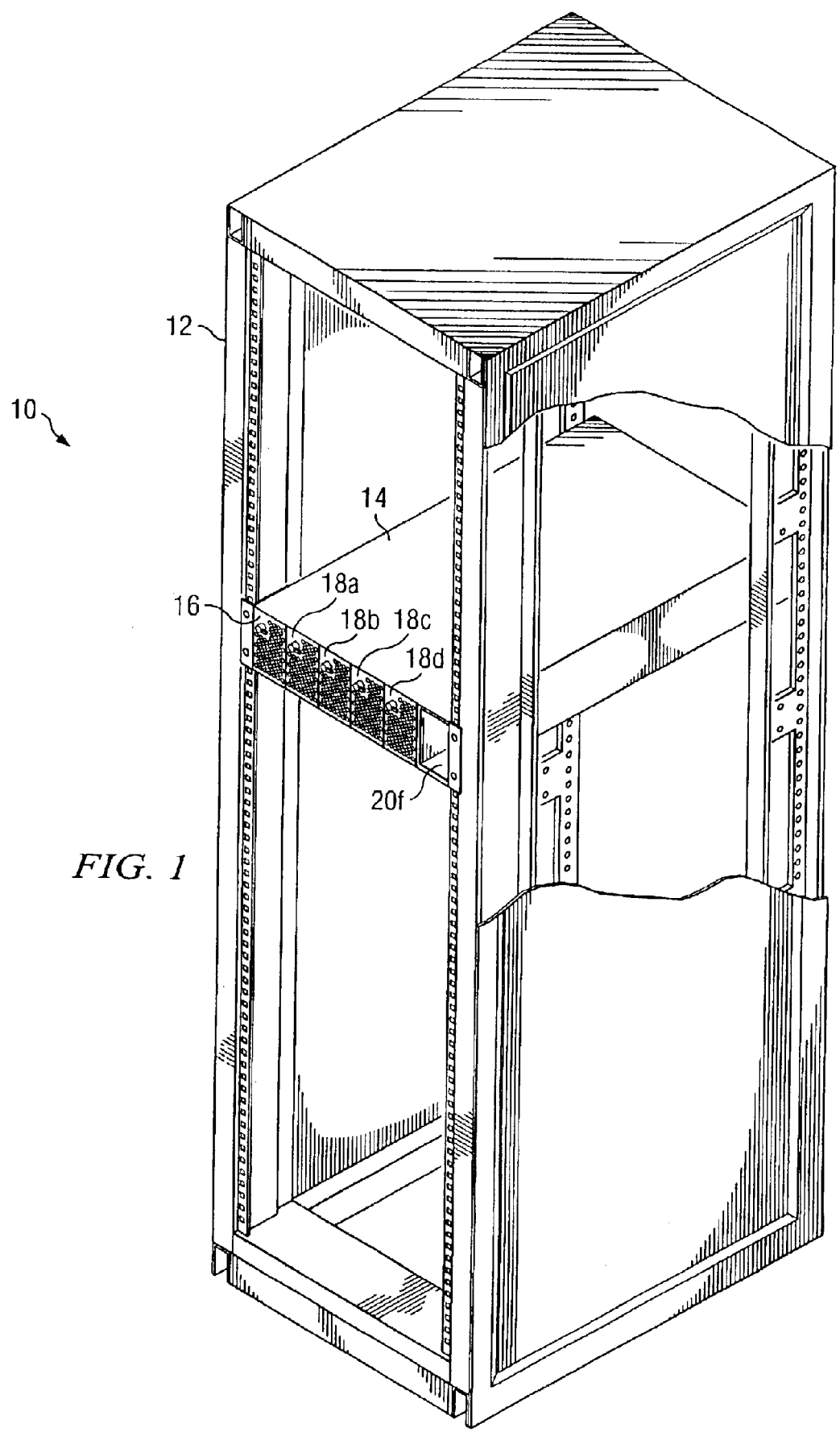
FIG. 1 illustrates a perspective diagram of an example information handling system.

FIG. 1 illustrates a perspective diagram of information handling system 10 including rack structure 12, modular chassis 14, computing module 16, and blank modules 18a–18d. Information handling system 10 shown in FIG. 1 represents one configuration for modular chassis 14, computing module 16, and blank modules 18. Information handling system 10 may be utilized in a computing center such as those used in any computer hardware intensive environment. In the embodiment shown in FIG. 1, rack structure 12 of information handling system 10 is a 42U rack structure and modular chassis 14 is a 3U sized chassis thereby allowing rack structure 12 to receive up to fourteen 3U modular chassis 14 disposed therein. In alternative embodiments, rack structure 12 may accept any combination and number of U-sized modular chassis 14 such that the total height of modular chassis 14 does not exceed 42U.

Modular chassis 14 is of a 3U size and includes six slots 20a, 20b, 20c, 20d, 20e, and 20f. Modular chassis 14 is operable to accept in slots 20a–20f up to six computing modules 16, up to six blank modules 18, or up to six of any combination of computing modules 16 and blank modules 18. In FIG. 1, computing module 16 is disposed in slot 20a, blank module 18a is disposed in slot 20b, blank module 18b is disposed in slot 20c, blank module 18c is disposed in slot 20d, blank module 18d is disposed in slot 20e, and slot 20f is empty. In alternate embodiments, modular chassis 14 may be of a different size than 3U and may include more than six or less than six slots to accept computing modules 16 and/or blank modules 18.

Computing modules 16 are modular computing components, such as blade servers, brick servers, power supplies, hard disk drives, or cooling fans, that are each complete modules and may be easily installed or removed within modular chassis 14. In the embodiment shown in FIG. 1, computing module 16 is a blade server. A blade server is a thin, ultra-dense, modular electronic circuit board containing one or more processors and memory. Server blades are complete computing systems due to the inclusion of processors, memory, and storage and network functionality on the single circuit board.

Figure 2A:
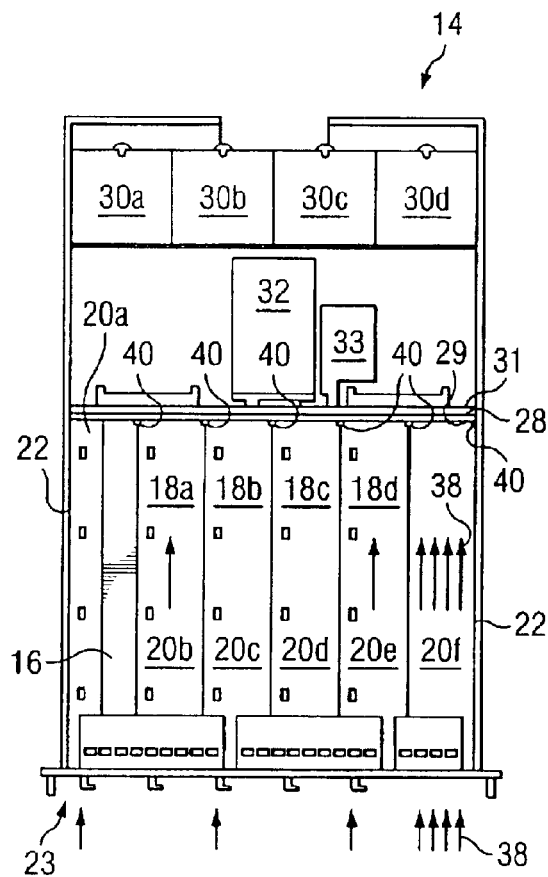
FIGS. 2A–2B depict a front view and a top view of an example modular chassis including an empty slot.
Figure 3A:
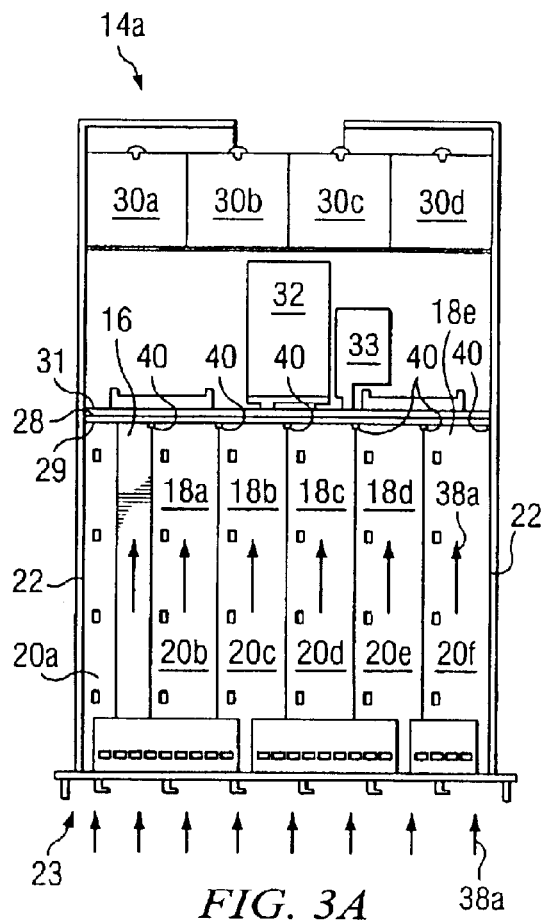
FIGS. 3A–3B illustrate a front view and a top view of an example modular chassis including no empty slots.
Figure 2B:
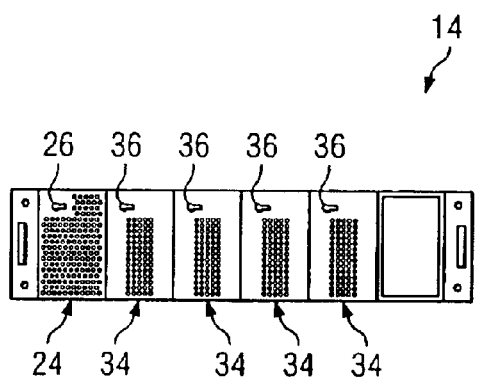
Figure 3B:
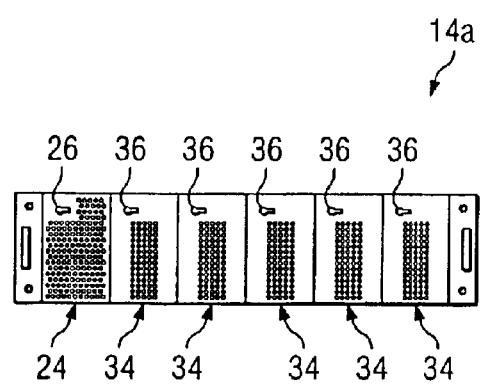

FIGS. 2 and 3 illustrate a top view and a front view of two different configurations of modular chassis 14 and illustrate how computing module 16 and blank modules 18 may be inserted and removed from slots 20. In one embodiment of modular chassis 14, computing components 16 and blank modules 18 may be removed from modular chassis 14 through front opening 23 of modular chassis 14. Computing module 16 includes housing 22 which encloses the necessary components of computing modules 16. For example, computing module 16 in FIGS. 1, 2 and 3 is a blade server and includes housing 22 that encloses the circuit board including the processor and memory. Housing 22 further includes a front section 24 which includes handle 26 which enables a user to install and remove computing module 16 in and out of modular chassis 14 and slot 20a.

When computing module 16 is installed in modular chassis 14, computing module 16 interfaces with midplane 28. Midplane 28 may be a circuit board and may include passive components such as connectors and resistors. Furthermore, midplane 28 may include connectors on side 29 facing computing module 16 as well as on side 31 opposite from computing module 16 so that computing module 16 may interface with devices, such as cooling fans 30, power supply 32, and management module 33, interfacing with side 31 of midplane 28. Management module 33 is disposed in a rear section of modular chassis 14 and couples with side 31 of midplane 28. Management module 33 may be a server management card or any other appropriate information handling system management device. When interfacing with side 29 of midplane 28, computing module 16 provides an electronic signal to management module 33 via midplane 28 so that management module 33 can identify and determine that a computing module 16 is installed in slot 20a Blank modules 18 do not include any of the electronic and/or computing components in computing module 16. In the embodiment shown in the FIGURES, blank modules 18 include only housing 22 of computing module 16 and none of the internal components such as a processor, memory, or circuit board, of computing module 16. Blank modules 18 include front section 34 different from front section 24 of computing module 16 and may also include handle 36 different from handle 26 of computing module 16. Front section 34 and handle 36 are different from front section 24 and handle 26 so that a user can easily determine upon viewing whether computing module 16 or blank module 18 is installed in a slot 20. For instance, front section 24 may have a different hole pattern than front section 34 and handle 36 may be a different color than handle 26. Also, front section 34 may have fewer holes than front section 24 in order to force more air flow through front sections 24 and over computing modules 16. Therefore, a user only seeing front sections 24 and 34 can quickly determine the type of module installed in each of slots 20. Although blank module 18 has been described as housing 22 including front section 36, in alternate embodiments blank module 18 may only be a front section and not include the full housing. In order to provide the desired functionality of acting as a substitute for computing module 16, blank module 18 can be of any type so long as blank module 18 has a large enough body and/or area to allow for proper and adequate air flow through modular chassis 14.

In FIGS. 2A and 2B, modular chassis 14 includes computing module 16 in slot 20a and blank modules 18a–18d in slots 20b–20e respectively. Slot 20 is empty. When computing module 16 is operating, it generates heat and must be cooled so that it does not overheat. Therefore modular chassis 14 includes four cooling fans 30a, 30b, 30c, and 30d. Although the embodiments of FIGS. 2 and 3 include four cooling fans 30, in alternate embodiments, modular chassis 14 may include more than four or less than four cooling fans. Cooling fans 30 pull in cooling air through front sections 24 and 34 so that the cooling air may pass over computing component 16 to cool it and prevent it from overheating. Blank modules 18 act as substitutes for computing modules 16 that are absent from modular chassis 14 and ensure that cooling air properly flows through modular chassis 14. Cooling problems are caused by changes in the pressure boundary conditions that control airflow through modular chassis 14. The increased open area of empty slot 20f causes decreased air flow through the remaining slots 20a–20e and therefore reduced cooling in those areas. But air, much like water or electricity, follows the path of least resistance. Therefore, since there is neither a computing module 16 or a blank module 18 installed in slot 20f, slot 20f is the path of least resistance and the majority of the cooling air travels through slot 20f as indicated by cooling arrows 38.

As shown in FIG. 2A, the majority of the cooling air travels in slot 20f with slots 20b and 20e receiving some cooling air and computing module 16 receiving little or no cooling air. Because computing module 16 is not receiving an adequate supply of cooling air, its operational temperature begins to increase. Computing module 16 and management module 33 sense the increasing operating temperature of computing module 16 and management module 33 determines that additional cooling is needed and therefore increases the operational speed of cooling fans 30 to provide additional cooling air. But because slot 20f remains empty, increasing the operational speed of cooling fans 30 results in an increase in the amount of cooling air traveling down slot 20f and very little increase in the amount of cooling air traveling over computing module 16. Therefore, the operating temperature of computing module 16 continues to increase because of inadequate cooling. As the operating temperature increases, management module 33 increases the increases the operational speed of cooling fans 30 in order to generate more cooling air but never achieves the desired effect of lowering the operating temperature of computing module 16. When cooling tans 30 increase to the maximum operational speed and the operating temperature of computing module 16 remains too high, computing module 16 shuts down to prevent system failure due to overheating. The shut down happens immediately without any warning to the user of information handling system 10 and results in ungraceful shutdowns, loss of data, and increased down-time.

The overheating of computing modules 16 in modular chassis 14 can be prevented by including a computing module 16 or a blank module 18 in each of slots 20. FIG. 3 includes computing component 16 in slot 20a and blank modules 18a–18e in slots 20b–20f respectively of modular chassis 14a. There are no empty slots 20 in modular chassis 14a of FIG. 3. Because there are no empty slots 20, all paths have similar resistance for the cooling air to follow. Therefore, the cooling air pulled in by cooling fans 30 through front sections 24 and 34 travels equally through each slot 20 of modular chassis 14a as shown by cooling arrows 38a allowing for computing component 16 to receive an adequate supply of cooling air and the operating temperature of computing module 16 to maintain a safe operating level that does not require shutting down information handling system 10.

Figure 4A:
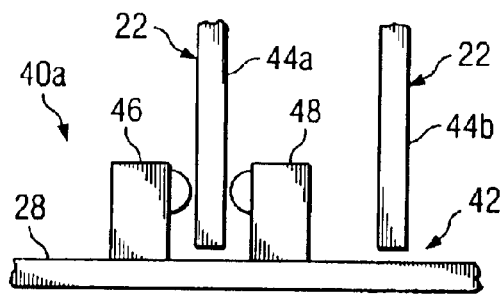
FIGS. 4A–4B depict two example embodiments of a sensor.
Figure 4B:
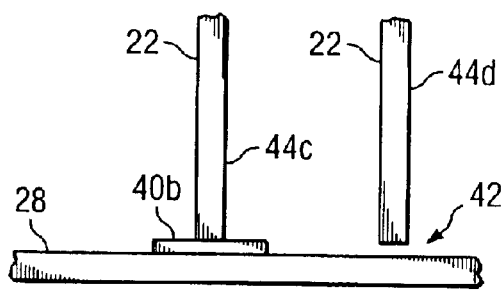

Because blank modules 18 include no electronics, management module 33 cannot detect the presence of blank modules 18 installed in slots 20 like management module 33 detects the presence of computing module 16 installed in slot 20. Therefore, sensors 40 are utilized to detect the presence of blank modules 18 in slots 20. FIGS. 4A and 4B illustrate two different embodiments of sensors. In the embodiments shown in FIGS. 3 and 4, there is an individual sensor 40 for each slot 20 and sensors 40 are disposed on side 29 of midplane 28. In alternate embodiments sensors 40 may be disposed anywhere within modular chassis 14 so that sensors 40 are operable to detect the presence of blank modules 18. For example, if blank modules 18 only included front section 34 and not housing 22, then sensors 40 may be disposed on a front portion of modular chassis 14 near front opening 23. Sensors 40 may be optical switches such as an infra-red sensor (as shown in FIG. 4A), contact sensors (as shown in FIG. 4B), magnetic switches, a continuity, or any other appropriate type of sensor.

In the embodiment shown in FIG. 4A, sensor 40a is an optical switch sensor utilizing infra-red. Sensor 40a is disposed on midplane 28 so that rear section 42 of housing 22 interfaces with sensor 40a. Shown in FIG. 4A are outside edges 44a and 44b of housing 22 at rear section 42 with outside edge 44a interfacing with sensor 40a. Sensor 40a includes infra-red ("IR") transmitter 46 and IR switch 48. IR transmitter 46 emits an IR beam to IR switch 48. As long as IR switch 48 receives the IR beam from IR transmitter 46, IR switch 48 remains open and management module 33 and sensor 40a determine that nothing is installed in slot 20. But when blank module 18 is installed in slot 20, outer edge 44a interrupts the IR beam from IR transmitter 46 to IR switch 48. When IR switch 48 no longer receives the IR beam, IR switch 48 closes. When IR switch 48 closes, management module 33 and sensor 40a determine that a module, either computing module 16 or blank module 18, is installed in slot 20. If management module 33 receives an electronic signal from the module installed in slot 20 then management module 33 knows that a computing module 16 is installed in slot 20. If management module 33 does not receive any electronic signal, then management module 33 determines that a blank module 18 is installed in slot 20. Sensor 40b, a contact sensor, operates in much the same fashion as sensor 40a. Rear section 42 of housing 22 interfaces with management module 33 and sensor 40b. When sensor 40b senses contact with outer edge 44c of housing 22, midplane 28 and sensor 40b determine that a module is installed in slot 20 and wait for an electronic signal to determine if the module is a computing module 16 or a blank module 18.

Figure 5:
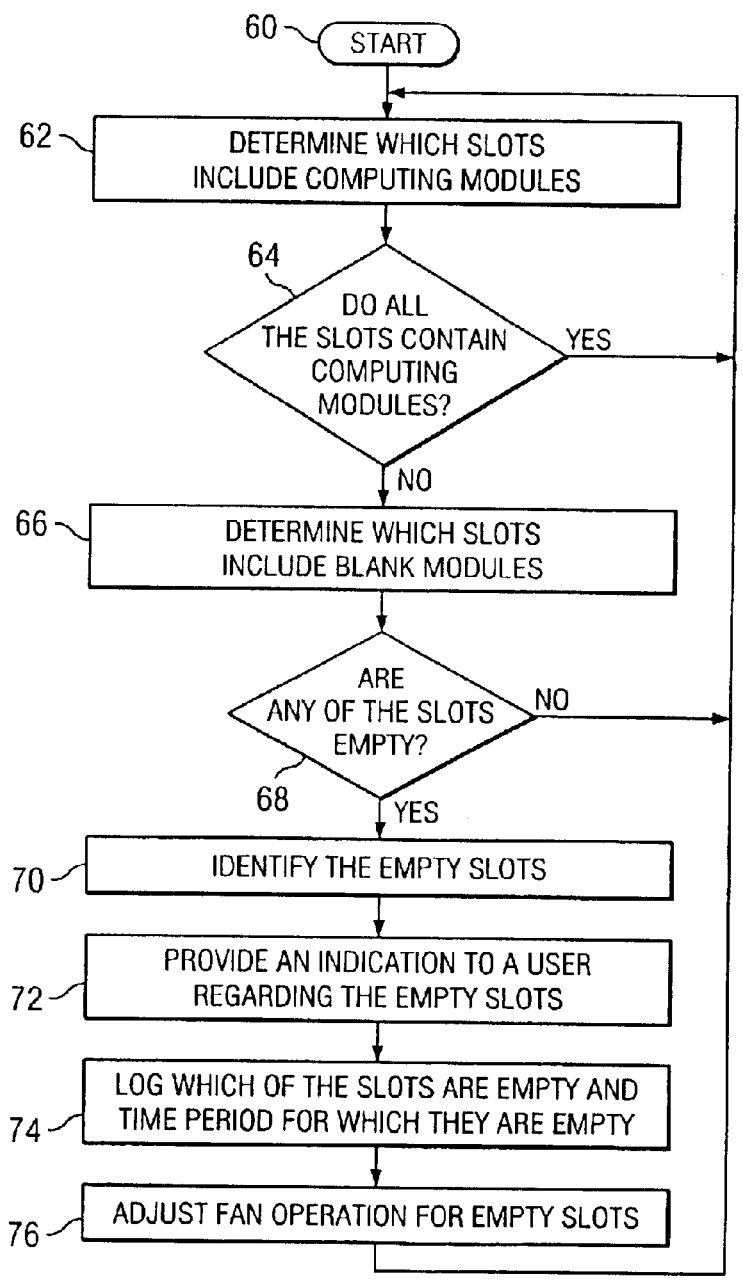
FIG. 5 illustrates a flow diagram of an example method for detecting blank modules.

FIG. 5 illustrates a flow diagram of an example method for detecting blank modules. The method begins at step 60 and at step 62 management module 33 determines which of slots 20 include computing modules 16. As described above, management module 33 determines if computing modules 16 are installed in slots 20 by receiving an electronic signal from computing modules 16. At step 64, management module 33 determines if all of slots 20 of modular chassis 14 include computing components 16. If all of slots 20 of modular chassis 14 include computing modules 14, then the process returns to step 62 where management module 33 continues to check for the installation of computing modules 16 in slots 20 so that management module 33 will be able to detect when a user removes one or more of the computing modules 16 from modular chassis 14.

If at step 64 all of slots 20 do not contain computing modules 16, then at step 66 sensors 40 and management module 33 determine which of slots 20 include blank modules 18. Sensors 40 check for blank modules 18 in slots 20 as described above arid management module 33 determines if the module detected by sensor 40 is actually a blank module 18 or a computing module 16 based on receipt of the electronic signal. At step 68, management module 33 utilizing sensors 40 determines if any of slots 20 are empty and therefore do not contain either a computing module 16 or a blank module 18. Management module 33 determines if there are any empty slots 20 by determining how many of slots 20 are occupied by computing modules 16, how many of slots 20 are occupied by blank modules 18 and subtracting that number from the total number of slots 20 in modular chassis 14. If there are no empty slots 20, then the process returns to step 62 where management module 33 and sensors 40 continue rechecking for any empty slots.

When there are empty slots 20 at step 68, then at step 70 sensors 40 identify empty slots 20. For example, in the embodiment of FIG. 2, sensors 40 would detect and identify that slot 20f is empty. Once the one or more empty slots 20 have been identified, at step 72 management module 33 provides an indication to a user of information handling system 10 that one or more of slots 20 are empty including which of slots 20 are empty. The indication may be provided by sending a message through the chassis level through the software to the console so that the user can view it, sending a text message to the user including the empty slots, flashing LEDs (light emitting diode) placed on modular chassis 14 indicating an empty slot, or any other appropriate way of communicating error messages to the user. Providing the indication to the user allows the user to react proactively in response to the one or more empty slots 20 without an immediate system shut down. If the user does not have any extra blank modules 18 for empty slots 20, then the user has the time to save all the necessary data and then shut down information handling system 10. Also, the user may install blank modules 18 into the empty slots 20 in order to prevent any installed computing modules 16 from overheating. Once management module 33 provides the indication, at step 74 management module 33 logs which of slots 20 are empty and how long the empty slots 20 remain empty so that if the user does not take any action with respect to the empty slots 20, there will be an accurate log of what caused information handling system 10 to overheat and shut down.

In addition to providing an indication, at step 76 management module 33 adjusts the operational speed of cooling fans 30 based on the number of empty slots 20. Management module 33 recognizes that one or more empty slots 20 result in improper cooling air flow through modular chassis 14 and the installed computing components 16 not receiving an adequate supply of cooling air. In order to account for the uneven airflow through modular chassis 14, management module 33 increases the operational speed of cooling fans 30 in an attempt to increase the amount of cooling air flowing over the installed computing components 16 to prologue information handling system 10 overheating until the user either shuts down information handling system 10 or installs blank modules 18 into empty slots 20. Once the fan speeds have been adjusted, the method returns to step 62 and step 62 through step 76 are repeated based on the modules installed in modular chassis 14.

Although the disclosed embodiments have been described in detail, it should be understood that various changes, substitutions and alterations can be made to the embodiments without departing from their spirit and scope. For example, the embodiment disclosed herein refers primarily to a 42U rack housing up to eighty-four blade servers. It is within the scope of the present disclosure to use a 24U rack or any other size rack operable to maintain any type of modular computing component or computing module therein.

What is claimed is:

1. An information handling system comprising:
   at least one computing module and at least one blank module;
   a modular chassis including a plurality of slots, the modular chassis operable to receive in each of the slots one of the computing modules or a blank module, the blank module comprising a module housing formed to allow adequate air flow through the chassis;
   a management module associated with the modular chassis and the computing module, the management module operable to detect the presence of one or more of the computing modules in one or more of the slots; and
   one or more sensors associated with the one or more slots, the computing module and the blank module, the one or more sensors operable to detect if one or more of the blank modules are installed in one or more of the slots.

2. The information handling system of claim 1 wherein the computing module comprises a modular server.

3. The information handling system of claim 1 wherein the one or more sensors comprise one or more optical switches.

4. The information handling system of claim 1 further comprising the one or more sensors disposed on a midplane.

5. The information handling system of claim 1 further comprising the sensor operable to provide an indication to a user when one of the slots does not include either the blank module or the computing module.

6. The information handling system of claim 1 further comprising a rack structure operable to releasably maintain one or more of the modular chassis therein.

7. The information handling system of claim 1 further comprising the blank module including one or more visual markings distinguishing the blank module from the computing module.

8. The information handling system of claim 1 further comprising a midplane associated with the modular chassis, the midplane operable to communicatively couple the computing module with the management module.

9. The information handling system of claim 1 further comprising the computing module operable to communicate an electronic signal to the management module indicating that the computing module is disposed within the slot.

10. The information handling system of claim 1 further comprising one or more cooling fans operable to cool the computing modules.

11. A method for detecting one or more blank modules in a modular system, the method comprising:
    determining if one or more computing modules are installed in one or more slots of a modular chassis;
    determining if one or more blank modules are installed in one or more of the slots of the modular chassis with a sensor associated with one or more sensors associated with the one or more slots, each blank module comprising a module housing formed to allow adequate air flow through the chassis;
    identifying one or more of the slots that are empty and contain neither the blank module nor the computing module; and
    providing an indication regarding the one or more empty slots.

12. The method of claim 11 further comprising adjusting an operational speed of one or more cooling fans when one or more of the slots are empty.

13. The method of claim 11 wherein determining if one or more computing modules are installed in one or more of the slots comprises transmitting an electronic signal from the computing module to a management module.

14. The method of claim 11 further comprising inserting one or more blank modules into one or more of the empty slots of the modular chassis.

15. The method of claim 11 wherein providing an indication regarding the one or more empty slots comprises communicating to a user an error message identifying which of the slots are empty.

16. The method of claim 11 further comprising logging a plurality of information regarding the one or more empty slots.

17. A system for detecting one or more blank modules in a modular system, the system comprising:
    one or more blank modules disposed in one or more slots of one or more modular chassis, each blank module comprising a module housing formed to allow adequate air flow through a modular chassis;
    one or more server modules disposed in one or more of the slots of the modular chassis, the one or more server modules operable to transmit an electronic signal to a management module; and
    a plurality of sensors associated with the slots and disposed on a midplane, the sensors operable to detect the presence of one or more of the blank modules in one or more of the slots and indicate to a user when one or more of the slots are empty.

18. The system of claim 17 further comprising the management module operable to determine if one or more of the server modules are installed in one or more of the slots.

19. The system of claim 17 wherein the sensors comprise a plurality of infra-red sensor.

\* \* \* \* \*